(12) United States Patent
Low (10) Patent No.: US 7,677,899 B2
(45) Date of Patent: Mar. 16, 2010

(54) LED LIGHT SOURCE MODULE AND LED BACKLIGHT MODULE USING THE SAME

(75) Inventor: Huan-Lian Low, Hsinchu (TW)

(73) Assignee: Young Lighting Technology Corporation, Hsinchu (TW)

( * ) Notice: Subject to any disclaimer, the term of this patent is extended or adjusted under 35 U.S.C. 154(b) by 0 days.

(21) Appl. No.: 12/052,930

(22) Filed: Mar. 21, 2008

(65) Prior Publication Data

US 2009/0068856 A1    Mar. 12, 2009

(30) Foreign Application Priority Data

Sep. 7, 2007    (TW) .............................. 96133465 A (51) Int. Cl.
*H01R 12/00* (2006.01)
(52) U.S. Cl. ........................................................ 439/56
(58) Field of Classification Search .................. 439/70, 439/69, 56; 257/99, 100, 98
See application file for complete search history.

(56) References Cited

U.S. PATENT DOCUMENTS

| 6,428,189 B1 | 8/2002 | Hochstein | |
|---|---|---|---|
| 7,211,835 B2 * | 5/2007 | Ono | 257/99 |
| 2004/0065894 A1 * | 4/2004 | Hashimoto et al. | 257/100 |
| 2004/0175189 A1 | 9/2004 | Weber-Rabsilber et al. | |
| 2004/0222433 A1 * | 11/2004 | Mazzochette et al. | 257/99 |
| 2004/0262717 A1 | 12/2004 | Arndt et al. | |

FOREIGN PATENT DOCUMENTS

| TW | I229725 | 3/2005 |
|---|---|---|
| TW | M286937 | 2/2006 |
| TW | 200719028 | 5/2007 |

* cited by examiner

*Primary Examiner*—Jean F Duverne
(74) *Attorney, Agent, or Firm*—Chun-Ming Shih (57) ABSTRACT

A LED light source module includes a printed circuit board and a plurality of LEDs. The printed circuit board has a plurality of through holes arranged in intervals. Each of the LEDs includes at least one LED chip and at least one metal board. The metal board has a supporting surface. The LED chip is arranged on the supporting surface. At least one of the LED chip and the metal board is contained in each through hole of the printed circuit board corresponding to the LED including the at least one of the LED chip and the metal board. Each of the LEDs electrically is connected with printed circuit board through the supporting surface of the metal board to make the LED chip be connected with the printed circuit board electrically.

16 Claims, 7 Drawing Sheets

LED LIGHT SOURCE MODULE AND LED BACKLIGHT MODULE USING THE SAME

FIELD OF THE INVENTION

The present invention relates to light source modules, manufacturing methods thereof, and backlight modules having the same, and more specifically, to a LED light source module, a manufacturing method thereof, and a LED backlight module having the LED light source module.

DESCRIPTION OF THE RELATED ART

In Liquid Crystal Displays (LCD), backlight modules are main light sources thereof. The backlight modules served as the light sources have characteristics such as light emitting capabilities and using lifetimes directly and closely related to displaying qualities and using lifetimes of terminal product displays. With the developing needs of environmental protection, power saving, colors and images, etc., a light emitting diode (LED) is widely used as the light source.

The LED is a semiconductor light source element, and has a light emitting capability and using lifetime highly sensitive to temperature. When the LED is emitting light, energy is converted into heat and the emitted light. If the heat does not dissipate quickly, the heat will congregate in the LED to increase the junction temperature of the light emitting location, such that the using lifetime, the efficiency and the photoelectric characteristics thereof will be degraded to offset the designed values. Thereby, it is necessary for the LED backlight module having an excellent heat-dissipating capability.

Figure 9:
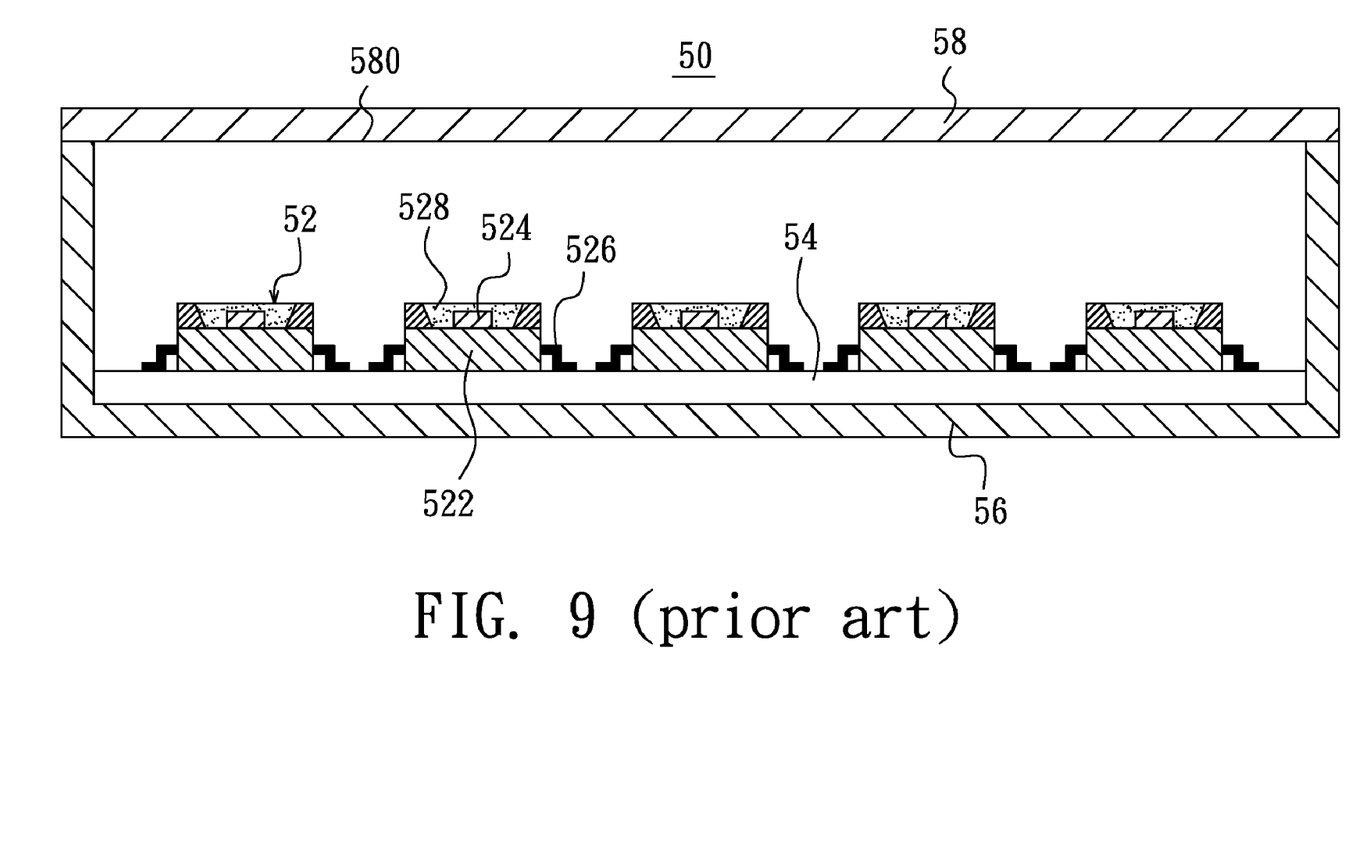
FIG. 9 is a schematic, cross-sectional view of a conventional LED backlight module.

Referring to FIG. 9, a conventional direct-type LED backlight module 50 includes a plurality of LEDs 52, a metal board, such as a metal core printed circuit board 54 (MCPCB), a metal back frame 56 and a light guide plate 58. Each of the LEDs 52 includes a substrate 522, a LED chip 524 arranged on the substrate 522, a metal lead frame 526 electrically connected with the LED chip 524, and a package 528 configured for sealing the LED chip 524. The plurality of LEDs 52 are arranged on the MCPCB 54 through the substrate 522 and electrically connected to the MCPCB 54 through the metal lead frame 526 to form the LED light source module 52. The LED chip 524 is provided with the power by the MCPCB 54. The LED light source module 52 is arranged on the metal back frame 56. The light guide plate 58 is arranged at a light emitting side 580 of the LED light source module 50 to make light emitted uniformly.

The heat generated from each LED 52 is dissipated through the substrate 522 or the metal lead frame 526, the MCPCB 54 and the metal back frame 56. That is, the heat generated from the LED 52 must pass through at least three layers to be dissipated, so that a long heat-dissipating distance is formed. The long heat-dissipating distance formed by the stacked layers will congregate much heat therein and increase the junction temperature of the LED 52, so that the light emitting capability and using lifetime of the LED 52 is bad. Furthermore, since the cost of the MCPCB 54 is high, the LED light source module and the direct-type LED backlight module 50 have a high cost by using the metal board having a large area, such as the MCPCB 54.

What is needed is a LED light source module and a LED backlight module using the same, which can solve the above problems.

BRIEF SUMMARY OF THE INVENTION

The present invention is to provide a LED light source module having a short heat-dissipating distance and low cost, a method for manufacturing such LED light source module, and a LED backlight module using such LED light source module.

A LED light source module, in accordance with a preferred embodiment of the present invention, includes a printed circuit board and a plurality of LEDs. The printed circuit board has a plurality of through holes arranged in intervals. The plurality of LEDs, each includes at least one LED chip and at least one metal board. The metal board has a supporting surface. The LED chip is arranged on the supporting surface. At least one of the LED chip and the metal board is contained in each through hole of the printed circuit board corresponding to the LED including the at least one of the LED chip and the metal board. Each LED electrically is connected with the printed circuit board through the supporting surface of the metal board to make the LED chip be connected with the printed circuit board electrically.

A method for manufacturing a LED light source module, in accordance with another preferred embodiment of the present invention, includes providing a printed circuit board having a plurality of through holes arranged in intervals; providing a plurality of LEDs, each including at least one LED chip and at least one metal board, the metal board including a supporting surface and the LED chip being arranged on the supporting surface; and electrically connecting the plurality of LEDs with the printed circuit board by using the surface mount technology to make at least one of the LED chip and the metal board of each of the LEDs be contained in each through hole of the printed circuit board corresponding to the LED including the at least one of the LED chip and the metal board.

A LED backlight module, in accordance with still another preferred embodiment of the present invention, includes a light guide plate, the above-mentioned LED light source module and a metal back frame. The metal back frame cooperates with the light guiding plate to define a containing space, and the LED light source module is arranged in the containing space. Each of the LEDs is connected with the metal back frame through a surface opposite to the supporting surface of the metal board.

The LED light source module arranges the LED chip on the metal board, so that the heat generated from the LED chip is dissipated directly through the metal board and the metal back frame, to decrease greatly the heat-dissipating distance. Furthermore, the decreased heat-dissipating distance will decrease the thickness of the LED backlight module. In addition, each through hole is arranged on the printed circuit board in intervals for providing power to the LED chip, so that the area of the metal board is decreased and the cost is also decreased.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein is better understood with respect to the following description and drawings, in which like numbers refer to like parts throughout, and in which.

DETAILED DESCRIPTION OF THE PREFERRED EMBODIMENT

In the following detailed description of the preferred embodiments, reference is made to the accompanying drawings which form a part hereof, and in which is shown by way of illustrating specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
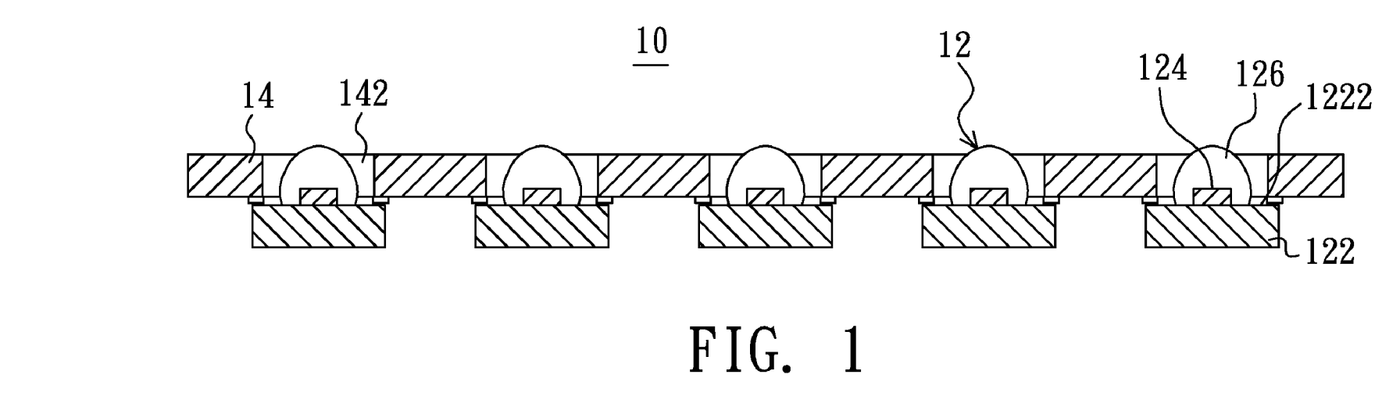
FIG. 1 is a schematic, cross-sectional view of a LED light source module of a first preferred embodiment of the present invention.
Figure 2:
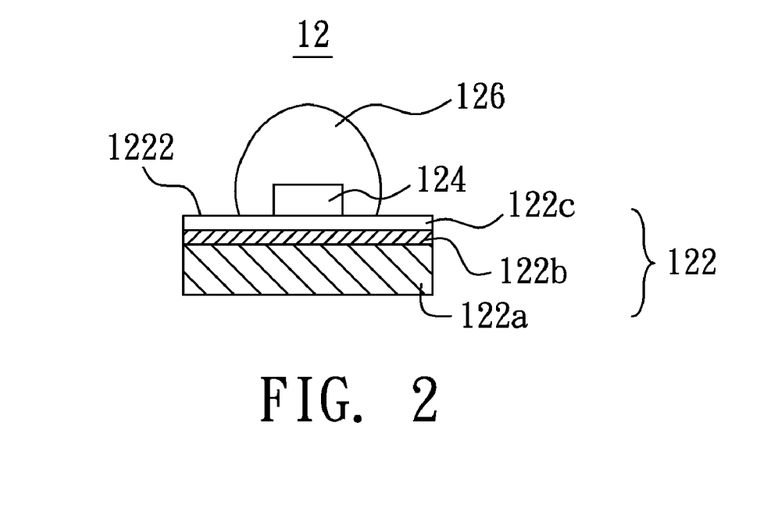
FIG. 2 is a schematic, enlarged view of a LED of the LED light source module in FIG. 1.

Referring to FIGS. 1 and 2, a LED light source module 10 in accordance with a first preferred embodiment of the present invention, includes a plurality of LEDs 12, and a printed circuit board 14.

Each of the LEDs 12 includes a metal board 122, a LED chip 124 and a package 126 formed on the metal board 122. The metal board 122 has a supporting surface 1222, and the LED chip 124 is arranged on the supporting surface 1222. The package 126 is arranged on the supporting surface 1222 to seal the LED chip 124 therein. The metal board 122 is a MCPCB made of a metal material having an excellent heat-conducting capability, such as aluminum, copper, etc. In this exemplary embodiment, referring to FIG. 2, the metal board 122 generally includes a metal substrate 122a, a conducting layer 122c and an insulating layer 122b arranged between the metal substrate 122a and the conducting layer 122c. The LED chip 124 is arranged on the supporting surface 1222 of the conducting layer 122c. The conducting layer 122c is made of a metal material, such as copper and so on. The conducting layer 122c has a circuit formed thereon. In the embodiment, the metal board 122 may be a metal core printed circuit board 122 (MCPCB)

The printed circuit board 14 has a plurality of through holes 142 arranged in intervals. At least one of the LED chip 124 and the metal board 122 is contained in the through hole 142 of the printed circuit board 14 corresponding to the LED 12 including the at least one of the LED chip 124 and the metal board 122. In this exemplary embodiment, the LED chip 124 of each of the LEDs 12 is contained in the through hole 142 of the printed circuit board 14 corresponding to the LED 12 including the LED chip 124. The metal boards 122 of the LEDs 12 are arranged at one side of the printed circuit board 14 in intervals, and the supporting surfaces 1222 is connected with the printed circuit board 14 to make the LED chips 124 electrically be connected to the printed circuit board 14 in series. The size of metal board 122 of each of the LEDs 12 is larger than that of the through hole 142 of the printed circuit board 14 corresponding to the LED 12 including the metal board 122.

Each of the LEDs 12 is not limited to have only one metal board 122 and only one LED chip 124. Each of the LEDs 12 may have a plurality of LED chips 124. Furthermore, each of the LED chips 124 may be comprised of red, green and blue LED chips. Alternatively, the LED chips 124 may be an ultraviolet or blue LED chip, which cooperates with fluorescent to emit white light, but it is not limited.

Figure 3:
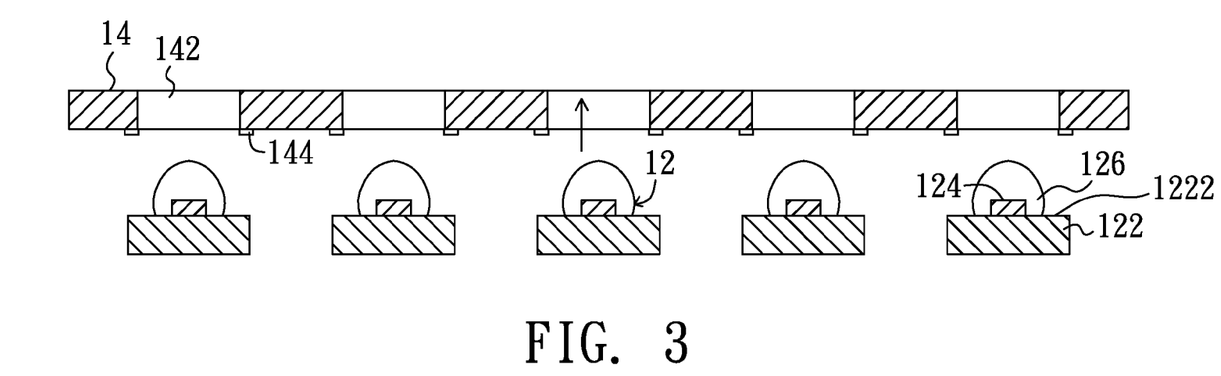
FIG. 3 is a schematic view for manufacturing the LED light source module in FIG. 1.

Referring to FIG. 3, a method for manufacturing the LED light source module 10 is described as follows. The method includes the steps of:

(1) providing a printed circuit board 14, the printed circuit board 14 having a plurality of through holes 142 arranged in intervals;

(2) providing a plurality of LEDs 12, each of the LEDs 12 including a metal board 122 and a LED chip 124, wherein the metal board 122 has a supporting surface 1222, the LED chip 124 is arranged on the supporting surface 1222, and the size of the metal board 122 is larger than that of the through hole 142 of the printed circuit board 14 corresponding to each of the LEDs 12 including metal board 122; and (3) electrically connecting the LEDs 12 with the printed circuit board 14 by using the surface mount technology (SMT), to make the LED chip 124 of each of the LEDs 12 be contained in the through hole 142 of the printed circuit board 14 corresponding to each of the LEDs 12 including the LED chip 124. This step further includes (i) forming a plurality of soldering tins 144 respectively adjacent to the through holes 142 of the printed circuit board 14;(ii) laying each of the LEDs 12 which is packaged independent of the printed circuit board 14 (as seen from FIG. 3) towards the printed circuit board 14 along a direction defined by an arrowhead as shown in FIG. 3 to contact the supporting surface 1222 of the metal board 122 of the each of the LEDs 12 with the soldering tin 144 adjacent to each of the through holes 142 of the printed circuit board 14 corresponding to each of the LEDs 12 including the metal board 122, the LED chip 124 being contained in the through hole 142 corresponding to each of the LEDs 12 including the LED chip 124, the metal boards 122 being arranged at one side of the printed circuit board 14 in intervals; (iii) heating the soldering tin 144 to be melted to make the supporting surface 1222 of the metal board 122 be connected with the printed circuit board 14 electrically, so that the LED light source module 10 is formed after being cooled.

Figure 4:
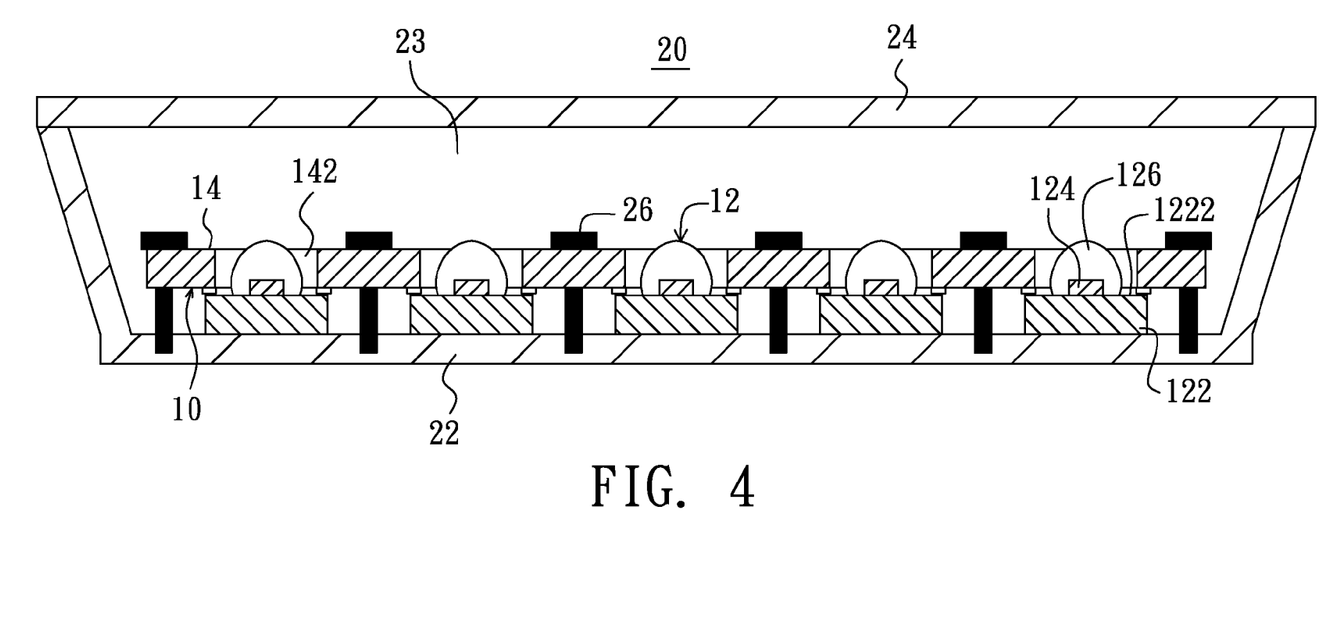
FIG. 4 is a schematic, cross-sectional view of a LED backlight module having the LED light source module in FIG. 1.

Referring to FIG. 4, a LED backlight module 20 having the LED light source module 10 is shown.

The LED backlight module 20 includes the LED light source module 10, a metal back frame 22 and a light guide plate 24.

A containing space 23, such as a chamber 23, is defined between the metal back frame 22 and the light guide plate 24. The light guide plate 24 is capable of uniforming the light emitted from the LED light source module 10. The LED light source module 10 is contained in the containing space 23, and each of the LEDs 12 is connected with the metal back frame 22 through a surface of the metal board 122 opposite to the supporting surface 1222. Thereby, the heat generated from the LEDs 12 may be dissipated effectively through the metal back frame 22. Generally, a thermal interface material, such as thermal grease, thermal pad and so on, may be inserted between the metal board 122 and the metal back frame 22 to provide an excellent heat-contacting capability between the light source module 10 of the LED and the metal back frame 22.

Preferably, a plurality of fixing elements 26, such as screw and etc., are arranged through the printed circuit board 14 and extended into the metal back frame 22 to fix the LED light source module 10 and the metal back frame 22. The fixing elements 26 are arranged in alternation with the through holes 142 of the printed circuit board 14. The fixing elements 26 are configured for steadily fixing the LEDs 12 of the LED light source module 10 between the printed circuit board 14 and the metal back frame 22 so that the LEDs 12 are not displace with the printed circuit board 14. Thereby it prevents an open circuit between the LEDs 12 and the printed circuit board 14 so that the LED backlight module 20 has an excellent aseismatic capability.

Furthermore, an optical film (not shown), such as a prism sheet, an brightness enhancement film, etc., may be arranged the light emitting surface of the light guide plate 24 of the LED backlight module 20 to improve the luminance and the brightness of the whole LED backlight module 20.

Figure 5:
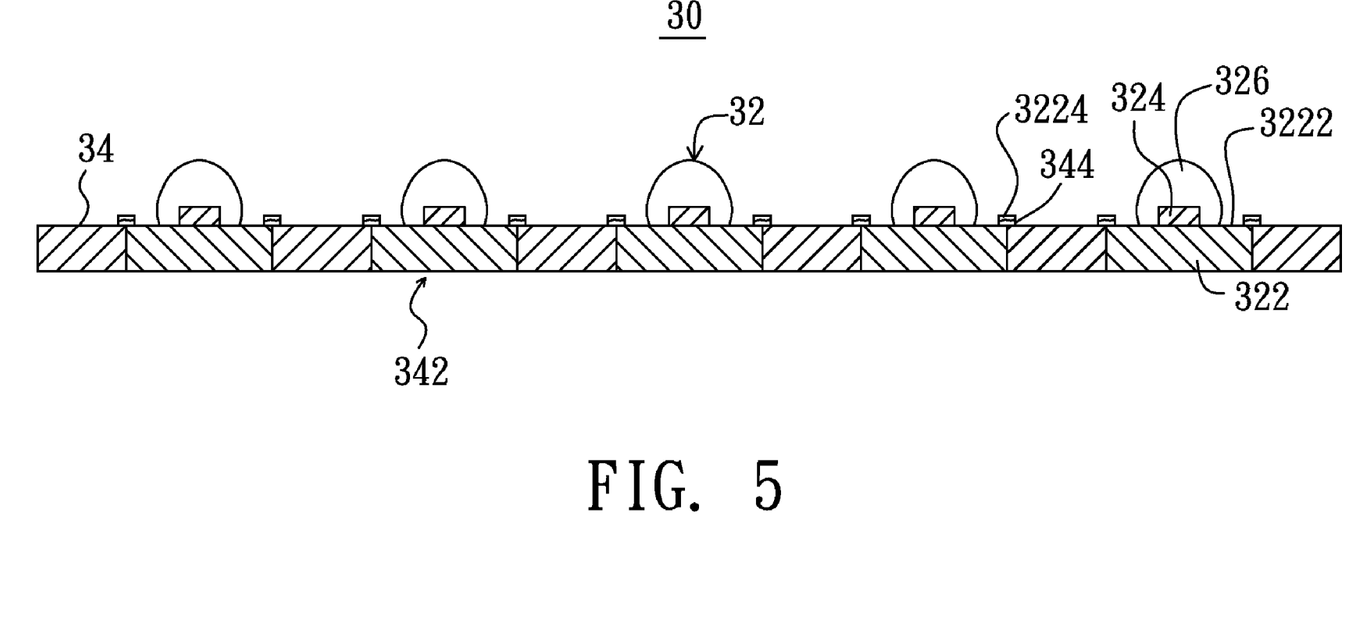
FIG. 5 is a schematic, cross-sectional view of a LED light source module of a second preferred embodiment of the present invention.

Referring to FIG. 5, a LED light source module 30 in accordance with a second preferred embodiment of the present invention is shown. The LED light source module 30 is similar to the light source module 10 as shown in FIG. 2, except that each metal board 322 of each LED 32 is also contained in each through hole 342 of the printed circuit board 34 corresponding to the LED 32 including the metal board 322, to arrange the each metal board 322 in intervals. Each metal board 322 has a thickness approximately same to that of the printed circuit board 34 to arrange each LED chip 324 arranged on the supporting surface 3222 of each metal board 322 out of each corresponding through hole 342 of the printed circuit board 34. The supporting surface 3222 of each metal board 322 is connected electrically with the printed circuit board 34 through a linear conductor 3224 of the supporting surface 3222 to make the each LED chip 324 be connected with the printed circuit board 34 electrically.

Furthermore, a cavity is formed on the supporting surface 3222 of the metal board 322 corresponding to the LED chip 324 to arrange the LED chip 324 therein. Therefore, each metal board 322 and the corresponding LED chip 324 are contained in each through hole 342 of the printed circuit board 34 corresponding to the LED 32.

Figure 6:
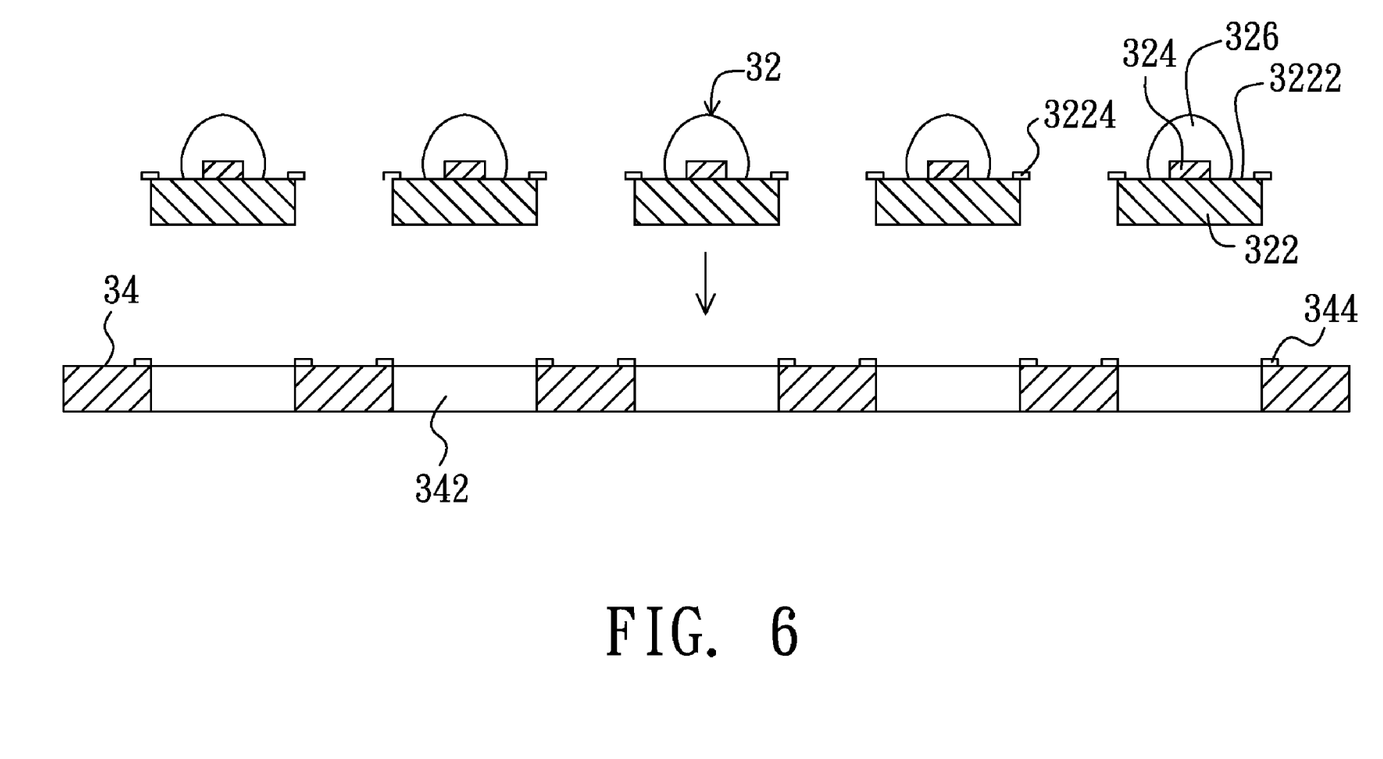
FIG. 6 is a schematic view for manufacturing the LED light source module in FIG. 5.

Referring to FIG. 6, a method for manufacturing the LED light source module 30 as shown in FIG. 5 is provided. The method is similar to that for manufacturing the LED light source module 10 as shown in FIG. 3, except that each of the LEDs 32 is electrically connected with the printed circuit board 34 by the surface mount technology to contain the metal board 322 of each of the LEDs 32 in each of the through holes 342 of the printed circuit board 34 corresponding to each of the LEDs 32 including the metal board 322. The method further includes (i) forming the linear conductor 3224 on the supporting surface 3222 of the metal board 322 of each of the LEDs 32 to be served as a pin, wherein the linear conductor 3224 is made of a lead or a resistor having 0 ohm; (ii) forming a plurality of soldering tins 344 respectively adjacent to through holes 342 of the printed circuit board 34; (iii) laying each of the LEDs 32 which is packaged independent of the printed circuit board 34 (as seen from FIG. 6) towards the printed circuit board 34 along a direction defined by an arrowhead as shown in FIG. 6 to contain the metal board 322 of each of the LEDs 32 in each of the through holes 342 of the printed circuit board 34 corresponding to each of the LEDs 32 including the metal board 322, the linear conductor 3224 on the supporting surface 3222 of the metal board 322 being electrically connected with the soldering tin 344 adjacent to each of the through holes 342 of the printed circuit board 34 corresponding to each of the LEDs 32 including the metal board 322, and the LED chip 324 being arranged out of each of the through holes 342 of the printed circuit board 34 corresponding to each of the LEDs 32 including the LED chip 324; (iv) heating the soldering tin 344 to make the linear conductor 3224 be connected with the printed circuit board 34 electrically, so that the LED light source module 30 is formed after being cooled.

Figure 7A:
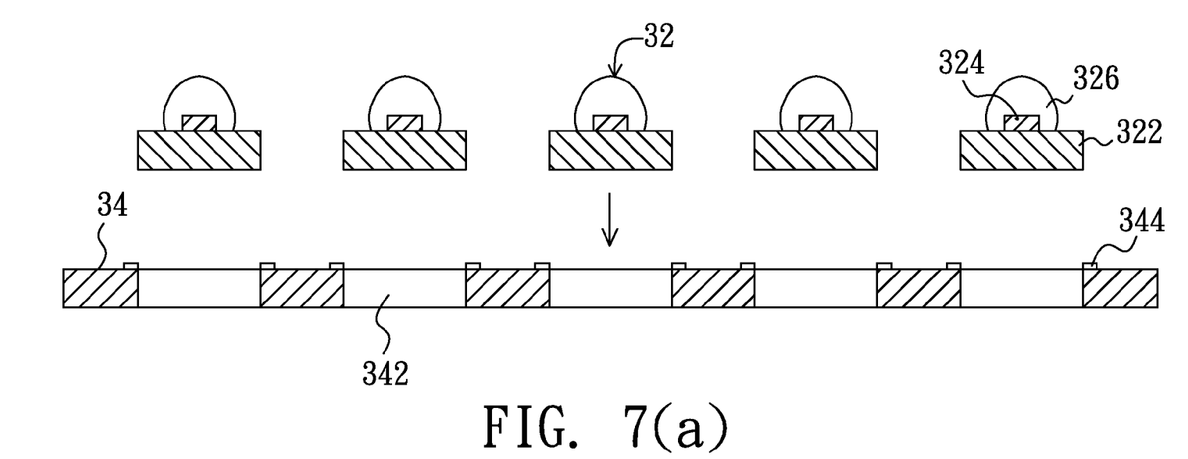
FIGS. 7(a) and 7(b) are schematic views for manufacturing the LED light source module in FIG. 5 according to another preferred embodiment.
Figure 7B:
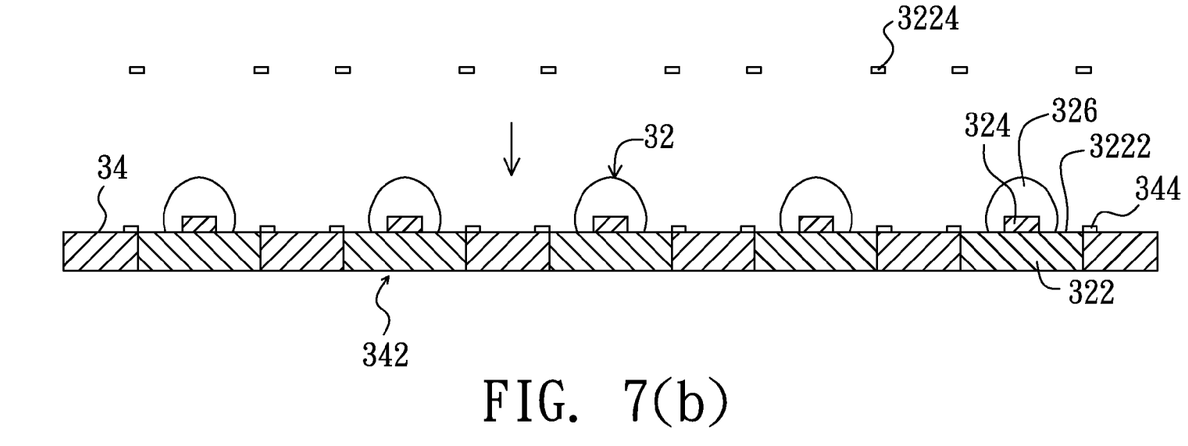

Referring to FIGS. 7(a) and 7(b), another method for manufacturing the LED light source module 30 as shown in FIG. 5 is provided. The method is similar to that for manufacturing the LED light source module 30 as shown in FIG. 6, except that (ii) laying the each of the LEDs 32 which is packaged independent of the printed circuit board 34 (as seen from FIG. 7(a)) towards the printed circuit board 34 along a direction defined by an arrowhead as shown in FIG. 7(a) to contain the metal board 322 of each of the LEDs 32 in each of the through holes 342 of the printed circuit board 34 corresponding to each of the LEDs 32 including the metal board 322, and the LED chip 324 being arranged out of each of the corresponding through holes 342 of printed circuit board 34; (iii) as shown in FIG. 7(b), laying each of the linear conductors 3224 towards the printed circuit board 34 in a direction defined by an arrowhead as shown in FIG. 7(b), and electrically connecting the supporting surface 3222 of each of the metal boards 322 with the soldering tin 344 adjacent to each of the through holes of the printed circuit board 34 corresponding to each of the LEDs 32 including the metal board 322.

Figure 8:
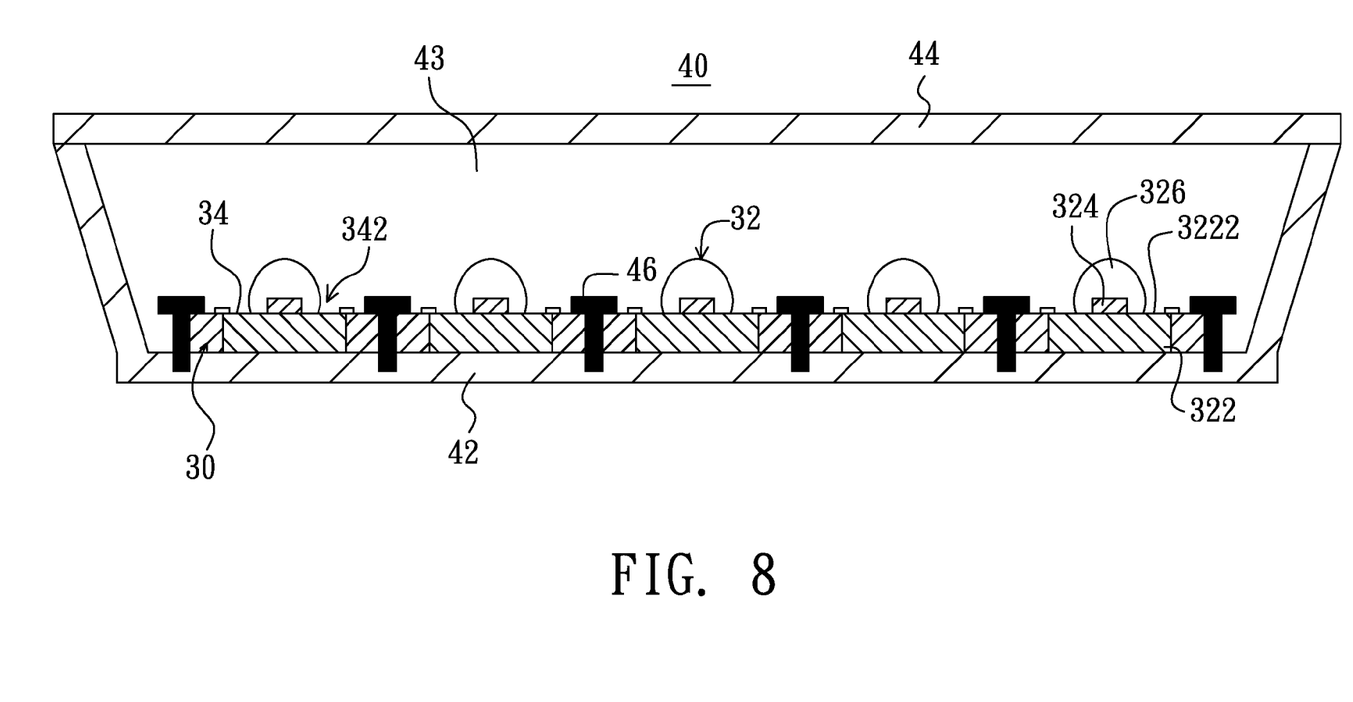
FIG. 8 is a schematic, cross-sectional view of a LED backlight module having the LED light source module in FIG. 5.

Furthermore, the LED light source module 30 manufactured by the method as shown in FIG. 6 or FIG. 7(b) may be employed to form a LED backlight module 40 as shown in FIG. 8. The LED backlight module 40 has functions similar to those of the LED backlight module 20 as shown in FIG. 4.

The light source module arranges the LED chip on the metal board, so that the heat generated from the LED chip is dissipated directly through the metal board and the metal back frame to decrease greatly the heat-dissipating distance. Furthermore, the decreased heat-dissipating distance will decrease the thickness of the LED backlight module. In addition, each through hole is arranged on the printed circuit board in intervals for providing the power to the LED chip so that the area of the metal board is decreased and the cost is also decreased.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light source module, comprising:
    a printed circuit board, having a plurality of through holes arranged in intervals; and
    a plurality of light emitting diodes packaged independent of the printed circuit board, each of the packaged light emitting diodes including at least one chip, at least one metal board and a package, the metal board having a supporting surface, the chip being arranged on the supporting surface, the package being arranged on the supporting surface to seal the chip therein, at least one of the chip and the metal board being contained in the through hole of the printed circuit board corresponding to the light emitting diode including the at least one of the chip and the metal board, and each of the light emitting diodes electrically being connected with the printed circuit board through the metal board and such that the chip is connected with the printed circuit board electrically by the supporting surface of the metal board.

2. The light source module as claimed in claim 1, wherein the chip of each of the light emitting diodes is contained in the through hole of the printed circuit board corresponding to the light emitting diode including the chip, and the metal boards of the light emitting diodes are arranged at one side of the printed circuit board in intervals and electrically connected with the printed circuit board.

3. The light source module as claimed in claim 2, wherein the size of the metal board of each of the light emitting diodes is larger than that of the through hole of the printed circuit board corresponding to the light emitting diode including the metal board.

4. The light source module as claimed in claim 1, wherein the metal board of each of the light emitting diodes is contained in the through hole of the printed circuit board corresponding to the light emitting diode including the metal board, and the metal board is electrically connected with the printed circuit board through the supporting surface and a linear conductor of the printed circuit board.

5. The light source module as claimed in claim 4, wherein the thickness of the metal board is the same as that of the printed circuit board.

6. The light source module as claimed in claim 1, wherein each of the light emitting diodes includes a plurality of chips, and the chips include at least one of red, green, and blue light emitting diode chips.

7. The light source module as claimed in claim 1, wherein the metal board is a metal core printed circuit board.

8. A backlight module, comprising:
    a light guide plate;
    a light source module including a printed circuit board and a plurality of light emitting diodes packaged independent of the printed circuit board, the printed circuit board having a plurality of through holes arranged in intervals, each of the packaged light emitting diodes including at least one chip, at least one metal board and a package, the metal board having a supporting surface, the chip being arranged on the supporting surface, the package being arranged on the supporting surface to seal the chip therein, at least one of the chip and the metal board being contained in the through hole corresponding to the light emitting diode including the at least one of the chip and the metal board, and each of the light emitting diodes electrically being connected with the printed circuit board through the metal board and such that the chip is connected with the printed circuit board electrically by the supporting surface of the metal board; and
    a metal back frame cooperating with the light guiding plate to define a containing space, the light source module being arranged in the containing space, and each of the light emitting diodes is connected with the metal back frame through a surface of the metal board opposite to the supporting surface of the metal board.

9. The backlight module as claimed in claim 8, further comprising a plurality of fixing elements being arranged in alternation with the through holes of the printed circuit board, passing through the printed circuit board from a side of the printed circuit board facing towards the light guide plate, and extending into the metal back frame to fix the light source module and the metal back frame.

10. The backlight module as claimed in claim 8, wherein the chip of each of the light emitting diodes is contained in the through hole of the printed circuit board corresponding to the light emitting diode including the chip, and the metal boards of the light emitting diodes are arranged at one side of the printed circuit board in intervals and electrically connected with the printed circuit board.

11. The backlight module as claimed in claim 10, wherein the size of the metal board of each of the light emitting diodes is larger than that of the through hole of the printed circuit board corresponding to the light emitting diode including the metal board.

12. The backlight module as claimed in claim 8, wherein the metal board of each of the light emitting diodes is contained in the through hole of the printed circuit board corresponding to the light emitting diode including the metal board, and the metal board is electrically connected with the printed circuit board through the supporting surface and a linear conductor of the printed circuit board.

13. The backlight module as claimed in claim 12, wherein the thickness of the metal board is the same as that of the printed circuit board.

14. The backlight module as claimed in claim 8, wherein the metal board is a metal core printed circuit board.

15. The backlight module as claimed in claim 8, wherein the each of the light emitting diodes includes a plurality of chips, and the chips include at least one of the red, green and blue light emitting diode chips.

16. A light source module comprising:
a printed circuit board, having a plurality of through holes arranged in intervals; and
a plurality of light emitting diodes, each of the light emitting diodes including a chip and a metal board, the chip being arranged on a supporting surface of the metal board, at least one of the chip and the metal board being contained in a corresponding one of the through holes of the printed circuit board, and each of the light emitting diodes being electrically connected with the printed circuit board by using a surface mount technology and such that the chip is electrically connected with the printed circuit board through the supporting surface of the metal board.

* * * * *